United States Patent [19]

Yoder

[11] Patent Number: 5,326,992

[45] Date of Patent: Jul. 5, 1994

[54] SILICON CARBIDE AND SICALN HETEROJUNCTION BIPOLAR TRANSISTOR STRUCTURES

[75] Inventor: Max N. Yoder, Falls Church, Va.

[73] Assignee: The United States of America as represented by the Secretary of the Navy, Washington, D.C.

[21] Appl. No.: 921,151

[22] Filed: Jul. 29, 1992

[51] Int. Cl.$^5$ ............... H01L 29/161; H01L 29/205; H01L 29/225
[52] U.S. Cl. ............................... 257/77; 257/198
[58] Field of Search ................. 257/77, 197, 198, 613

[56] References Cited

U.S. PATENT DOCUMENTS

| | | | |
|---|---|---|---|
| 4,382,837 | 5/1983 | Rutz | 156/610 |
| 4,912,063 | 3/1990 | Davis et al. | 437/100 |
| 4,912,064 | 3/1990 | Kong et al. | 437/100 |
| 4,945,394 | 7/1990 | Palmour et al. | 257/77 |
| 5,087,576 | 2/1992 | Edmond et al. | 437/22 |

FOREIGN PATENT DOCUMENTS 61-63068  4/1986  Japan ..................... 257/77

OTHER PUBLICATIONS

Dmitriev, "SiC-Based Solid Solutions: Technology and Properties," Proc. 3rd International Conference on Amorphous and Crystalline Silicon Carbide and other Group IV-I.V Materials, Howard University, Wash. D.C. Apr. 11-13, 1990.

Yoder et al. "Silicon Carbide Comes of Age," Naval Research Reviews, Mar. 1989 pp. 26-33.

*Primary Examiner*—Sara W. Crane
*Assistant Examiner*—John F. Guay
*Attorney, Agent, or Firm*—William F. McCarthy; Thomas E. McDonald; John G. Wynn

[57] ABSTRACT

A heterojunction bipolar transistor (HBT) structure is configured so that the heterojunction between hexagonal and cubic materials is electrically active. A first embodiment of the HBT structure comprises both hexagonal and cubic silicon carbide (SiC). The emitter region is fabricated from the higher bandgap hexagonal SiC appropriately doped. The base and collector regions are grown using the lower bandgap cubic SiC. A second embodiment of the HBT structure comprises both a solid solution of SiC material such as an alloy of silicon carbon aluminum nitrogen (SiCAlN) grown upon a substrate of hexagonal SiC. The emitter region can be placed either on the top or bottom of the second embodiment of the HBT structure. Also, the bandgap between the emitter and base regions of the second embodiment can be varied by controlling the mole fraction ratio between the constituent parts of the SiCAlN, i.e., between the SiC and the AlN.

18 Claims, 1 Drawing Sheet

SILICON CARBIDE AND SICAlN HETEROJUNCTION BIPOLAR TRANSISTOR STRUCTURES

BACKGROUND OF THE INVENTION

1. Field of the Invention

The present invention relates generally to heterojunction bipolar transistor structures, but more particularly it relates to heterojunction bipolar transistor structures having both cubically and hexagonally structured silicon carbide and/or SiCAlN electrically active regions.

2. Description of the Prior Art

Silicon carbide (SIC) material exists in many configurations known as polytypes. As a semiconductor material, one configuration, termed cubic SiC because of its cubic crystalline structure, has been the subject of worldwide research because it possesses the electron velocity versus electric field characteristics most suitable for microwave and millimeter wave power transistor devices. In the past, much of the research on the growth of cubic (3C) (beta) SiC thin films has been on silicon substrates. The resulting thin films of this earlier research were of poor quality, e.g., typically the thin films contained $10^{16}$ defects/cm$^2$. The best of the devices represented by this earlier research is disclosed in U.S. Pat. No. 4,912,063 to Davis et al., entitled "Growth of Beta-SiC Thin Films and Semiconductor Devices Fabricated Thereon". In the more recent past, methods have been developed to heteroepitaxially grow high quality cubic (3C) (beta) thin films of SiC on hexagonal (6H) (alpha) SiC substrates having a crystalline orientation on the basal plane (c-axis) or within ±0.10° thereof. Thus, using these methods, the thin films produced were of comparatively high quality, e.g., typically these thin films contained only $10^4$ defects/cm$^2$. Homojunction planar bipolar transistors have been formed on these films by using, inter alia, high temperature ion implantation of doping ions such that the base and emitter regions are formed therein. Using a similar but somewhat different approach, homojunction mesa bipolar transistors have also been formed on these films. The homojunction devices represented by this research are disclosed in U.S. Pat. No. 4,945,394 to Palmour et al., entitled "Bipolar Junction Transistor on Silicon Carbide".

In homojunction planar or mesa bipolar transistors as disclosed in Palmour et al., the transistor gain is derived from the ratio of the emitter doping concentration to the base doping concentration. For a current gain of 10, the base doping must be at least 10 times less than the emitter doping concentration. While this is tolerated in many applications, the lower base doping requirements lead to excessive base resistance and the resulting resistance times capacitance (RC) time constant of the emitter-base junction precludes operation at extremely high frequencies. In the homojunction bipolar devices of Palmour et al., both electrons and holes cross the emitter-base junction (in a typical ratio of 10:1). This leads to unwanted charge carrier storage effects in the emitter-base junction and these unwanted charge carriers inhibit the ability to rapidly turn off the transistor. Heterojunction bipolar transistors (HBTs) are well known in the III-V semiconductor materials wherein the material of the base is easily lattice-matched to the material of the emitter. The most common example being the use of an aluminum gallium arsenide (Al-GaAs) emitter and a gallium arsenide (GaAs) base and collector. The efficacy of the npn HBT is that it provides virtually no barrier for electrons, but a large barrier for holes (or conversely in a pnp structure, virtually no barrier for holes and a large barrier for electrons). This is contrasted to a conventional homojunction bipolar transistor where the electron and hole barrier are essentially equal. In the HBT, charge carriers move in only one direction across the emitter-base junction resulting in an extremely large current gain—providing that there are few defects at the emitter-base junction to create interface charge states. The base in a HBT, unlike the base of the conventional homojunction bipolar transistor, can be impurity doped to a greater concentration than the emitter with negligible effect on gain. As such, the base resistance can be made to be very low and the device can operate at extremely high frequencies. While the use of SiC as a semiconductor material, as taught in Palmour et al., offers many advantages over conventional semiconductor materials in the fabrication of homojunction bipolar transistor devices, there is a need in the prior art to eliminate the excessive base resistance and the resulting resistance times capacitance (RC) time constant thereof in an improved manner.

As discussed in Palmour et al., the prior art is replete with examples of attempts to grow quality thin films, as well as attempts to fabricate junctions, diodes, transistors and like structures using SiC materials. SiC is difficult to work with because it occurs in more than 170 different one-dimensional ordering sequences without apparent variation in stoichiometry. As previously mentioned, these sequences or configurations are known as polytypes. It is also well known in the prior art that cubic (3C) SiC can be grown on [0001] oriented SiC wafers as described in the publication by Yoder et al., entitled "Silicon Carbide Comes of Age" Naval Research Reviews, March 1989, pp. 26-33. Field effect transistors (FETs) have been fabricated in these resultant 3C SiC on 6H SiC films. As far as is known, in these and all other devices using 3C SiC on 6H SiC, the hexagonal 6H SiC substrate has not been electrically active. Hence, the 6H SiC substrate was merely used as a "holder" for the electrically active 3C SiC superstrate layers.

As discussed in Palmour et al. and Yoder e.t. al., aforementioned, as a semiconductor material, silicon carbide (SIC) offers many advantages over conventional semiconductors. Its chemical bonds are much stronger than those of conventional semiconductors thus rendering it a much harder material (less vulnerable to scratching during processing). These strong chemical bonds render its interatomic spacing (lattice constant) considerably shorter than that of conventional semiconductors. This hardness also suppresses the diffusion or migration of dopant impurities within the semiconductor. As such, the diffusion dominated wear out mechanism typical of III-V power transistors is absent in transistors made of SiC. The high relative hardness of SiC also renders it more immune to radiation damage. The dielectric constant of SiC is only 9.5 as compared to 11.8 for silicon, 12.8 for GaAs, and 14 for InP. This lower value significantly reduces the parasitic capacitance loss in SiC integrated circuits and extremely high frequency transistors. Unlike the conventional III-V semiconductors, SiC does not exhibit a region of negative electron mobility to reduce frequency response at high power. Stated differently, its charge carrier velocity is highest at the high values of electric field strength—exactly the property required for a combination of high power at high frequency operation.

To reiterate, the attributes of SiC have long been known; however, until recently SiC semiconductor material could not be produced with sufficient perfection to lead to viable production yields of electronic devices. For all of its superlative attributes, SiC suffers from the lack of other lattice-matched materials of its IV—IV semiconductor group. This is the reason, it is believed, that there has been no meaningful heterojunction activity in SiC devices. However, with the advent of single crystalline cubic (3C) SiC films grown on single crystalline hexagonal (6H) SiC wafers, this limitation can be overcome.

To amplify the above teachings, it is believed that the advantages of HBT transistors have not accrued to conventional stoichiometric SiC technology because there have been no suitable lattice-matched interface semiconductor materials. Attempts to fabricate devices by growing non-lattice-matched stoichiometric SiC emitters on lower bandgap silicon base and collector films are known in the prior art, but the severe lattice mismatch between these materials resulted in large interface state densities thereby rendering the devices virtually useless. Such devices (by virtue of the much lower breakdown voltage of silicon) are also not capable of providing the above-stated advantages of devices comprised solely of SiC. Non-stoichiometric SiC emitters on silicon base and collector structures including heterojunction bipolar transistor (HBT) structures have also been described in a U.S. patent application by Goodman et al., entitled "Trenched Bipolar Transistor Structures", U.S. Ser. No. 07/796,553, filed on Nov. 22, 1991, and assigned to the same assignee as the present application. These HBT structures, while overcoming the interface problem, greatly reduce the magnitude of the heterojunction offset potential and thereby limit the magnitude of the charge carrier velocity advantages that can be achieved in a complete SiC HBT structure. The non-stoichiometric approach also suffers the same disadvantages of the stoichiometric SiC on silicon device relating to breakdown voltages. Consequently, there is a need in the prior art to fabricate a silicon carbide (SIC) heterojunction bipolar transistor (HBT) structure having an electrically active heterojunction of cubic (beta) type SiC material on a substrate of higher bandgap hexagonal (6H) (alpha) type SiC material in an improved manner.

A silicon carbide (SIC) heterojunction bipolar transistor structure, which uses cubic (beta) SiC on hexagonal (alpha) SiC to form an electrically active heterojunction, according to the present invention, is believed an improvement over the prior art. This is so, inter alia, because the bandgap of cubic (beta) SiC is 2.2 eV while that of hexagonal (alpha) SiC is 3.0 eV, which permits a heterojunction offset potential of 0.4 eV between these two polytypes of SiC material. While the present structure has many attributes as previously disclosed, there is room in the prior art for improvements in at least three important areas, e.g., increase the variation in bandgaps (including larger heterojunction offset potentials), eliminate double positioning boundary defects and fabricate structures in an emitter region up configuration.

As further background, solid solutions of silicon carbide (SIC) are well known in the prior art. The alloy of silicon carbon aluminum nitrogen (SiCAlN) is believed to have the greatest potential as a semiconductor material. Single crystalline semiconducting thin films of SiCAlN are disclosed in U.S. Pat. No. 4,382,837 to Rutz, entitled "Epitaxial Crystal Fabrication of SiC:AlN". Various mole fraction ratios of SiCAlN were described in the publication by Dmitriev, entitled "SiC-Based Solid Solutions: Technology and Properties" Proc 3rd Int'l Conf on Amorphous and Crystalline Silicon Carbide and Other Group IV—IV Materials, Howard University, Washington, D.C., Apr. 11–13, 1990, pp. 1–21. Since aluminum nitride (AlN) is latticed-matched to silicon carbide (SIC), virtually any mole fraction ratio of this material can be synthesized with resulting bandgaps of 2.2 eV for cubic SiC through 6.2 eV for hexagonal (2H) AlN. This permits a heterojunction offset potention of 1.5 eV between these two compounds.

To continue, when SiC layers are grown epitaxially on 6H SiC substrates, the resulting layers can be either 6H, 3C, or mixture of 3C and 6H in crystalline structure. If the 6H substrate is cut such that its surface is >3.0° off the [0001] basal plane, then the resulting epitaxial layer is entirely of 6H structure. If the orientation is <0.10° off the [0001] basal plane, then the resulting epitaxial layer is entirely of 3C structure. As previously mentioned, this 3C structured material can be characterized by unwanted double positioning boundary defects.

Recently, epitaxial layers of SiCAlN have been grown on 6H SiC substrates oriented between 0.10° and 3.0° of the [0001] basal plane. In all cases (and unlike the 3C SiC on 6H SiC case), these films were of 3C crystalline structure and without double positioning boundary defects. This is truly an unexpected and as yet unexplained, but reproducible result. Growth was by atomic layer epitaxy (ALE) subjecting the 1120 Celsius 6H SiC surface in sequence to silane ($SiH_4$), triethyl aluminum [$(C_2H_5)_3Al$], ethylene ($C_2H_4$), and ammonia ($NH_3$) after which the cycle was repeated layer by layer. The bandgap of such material is from 2.2 eV to 5.2 eV depending on the mole fraction ratio between the SiC and the AlN constituent parts (Since this is 3C material, the maximum bandgap is 5.2 rather than 6.2 eV for pure 3C AlN.) At mole fractions of AlN exceeding 40.3%, the bandgap of the SiCAlN exceeds that of the 6H SiC substrate on which it is grown while with lower mole fractions, the bandgap of the resulting epitaxial layer is less than that of the underlying 6H SiC substrate.

Epitaxial films of SiCAlN grown by ALE on 6H SiC substrates are of a quality superior to those of 3C SiC films grown on 6H SiC substrates. Moreover, and unlike 3C epitaxial films of pure SiC, the bandgap is controllable between 2.2 and 5.2 eV thereby rendering these films efficacious for heterojunction devices and particularly so for heterojunction bipolar transistors. This efficacy derives from (1) the absence of significant strain at the interface between the 6H SiC substrates and the overlying SiCAlN epitaxial films, (2) the relative similarity of bond angles between the substrate and the epitaxial overlayer thereby reducing the possibility of interface electronic traps that are deleterious to electron devices and (3) the absence of double positioning boundary defects in the overlying SiCAlN layers. Consequently, there is a need in the prior art to fabricate an improved heterojunction bipolar transistor using a solid solution of silicon carbide such as SiCAlN, according to the present invention.

OBJECTS OF THE INVENTION

Accordingly, an important object of the present invention is to configure a heterojunction bipolar transistor structure to include an electrically active heterojunction of semiconducting grade single crystalline cubic (beta) type SiC grown on a substrate of higher bandgap hexagonal (alpha) type SiC.

A corollary object of the foregoing important object is to configure the heterojunction bipolar transistor structure to include an emitter region of either n-type or p-type alpha SiC, a base region of either p-type or n-type beta SiC and a collector region of either n-type or p-type beta SiC, respectively.

Yet another important object of the present invention is to configure the heterojunction bipolar transistor structure to include an electrically active heterojunction of a semiconducting grade single crystalline solid solution type silicon carbide material such as an alloy of silicon carbon aluminum nitrogen (SiCAlN) grown on a substrate of hexagonal (alpha) type SiC thereby creating a high quality cubic polytype thin film, but without the possibility of double positioning boundary defects attributable to cubic polytype thin films of pure SiC.

A corollary object of the foregoing and another important object is to be able to vary the bandgap of the overlying SiCAlN material from 2.2 eV to 5.2 eV so as to tailor the heterojunction bipolar transistor structure to many different applications.

Another corollary object of the foregoing and another important object is to configure the heterojunction bipolar transistor structure to have either a collector region up or an emitter region up configuration.

Yet another corollary object of the foregoing and another important object is to configure the heterojunction bipolar transistor structure to be of an npn or pnp type.

SUMMARY OF THE INVENTION

In accordance with the above stated objects, other objects, features and advantages, the present invention has as a primary purpose to configure improved heterojunction bipolar transistor structures of both hexagonal and cubic silicon carbide (SIC), and of both hexagonal SiC and a solid solution alloy of silicon carbon aluminum nitrogen (SiCAlN) material wherein the very high bandgap offset between the hexagonal SiC and cubic SiC or the hexagonal SiC and cubic SiCAlN material permits carriers from the hexagonal material to be injected into the cubic material, but provides a potential barrier for carriers in the cubic material from being back injected into the hexagonal material.

The essence of the present invention is in configuring the heterojunction bipolar transistor structures so that the heterojunction between the hexagonal and cubic materials is electrically active, i.e., the hexagonal material (substrate) is not merely used as a "holder" for the electrically active subsequent cubic material superstrate layers.

The primary purpose of the present invention is carried out in a first embodiment by configuring the heterojunction bipolar transistor of both hexagonal and cubic silicon carbide (SIC). The emitter region comprises the higher bandgap hexagonal material appropriately doped (e.g., with donors for an npn-type transistor and with acceptors for a pnp-type transistor). Both the base and collector regions comprise the lower bandgap cubic SiC. Added upper frequency performance results from a collector region made of the electronically superior cubic material. The heterojunction bipolar transistor structure, according to the present invention, relies on bandgap discontinuity and potential barriers to prohibit charge carriers from the base region from being back-injected into the emitter region and thereby reducing gain. This permits base and emitter regions to each be optimally impurity doped.

The primary purpose of the present invention is carried out in a second embodiment by configuring the heterojunction bipolar transistor structure of the cubic SiCAlN material grown on a substrate of hexagonal SiC. The underlying hexagonal type SiC substrate of this embodiment of the present invention can be used as either the emitter region or the collector region of the heterojunction bipolar transistor structure. Also, the bandgap of the cubic SiCAlN material can be controlled between 2.2 eV and 5.2 eV. The foregoing choices are dependant on the mole fraction ratio between SiC and the AlN constituent parts. Accordingly, these choices will also permit the emitter region to be placed either on the top of the structure or on the bottom thereof. Consequently, depending on the doping profiles, concentrations and impurities, this embodiment of the present invention can be configured in a collector region up npn or pnp structure, or in an emitter region up npn or pnp structure.

BRIEF DESCRIPTION OF THE DRAWINGS

The previously stated objects, other objects, features and advantages of the present invention will be apparent from the following more particular description of the preferred embodiments as illustrated in the accompanying drawings, in which.

DESCRIPTION OF THE PREFERRED EMBODIMENTS

As discussed previously but reiterated here, heterojunction bipolar transistors (HBTs) comprising both hexagonal (6H) (alpha) cubic (3C) (beta) silicon carbide (SIC) semiconductor materials have numerous performance advantages. Thus, a SiC HBT structure has been configured to take advantage of the lattice-matched, low interface state density heterojunction that exists between 6H SiC and 3C SiC overlying films, i.e., exploiting the advantages of a wholly SiC transistor and a HBT simultaneously.

Figure 1A:
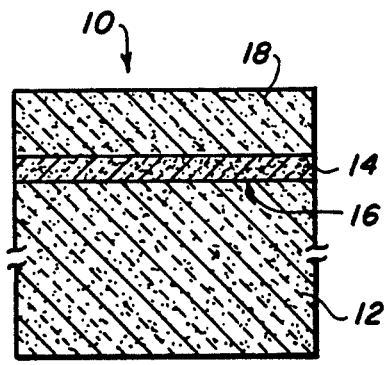
FIGS. 1a and 1b are cross sectional views, in schematic form, illustrating a first embodiment of npn and pnp versions, respectively, of collector region up heterojunction bipolar transistor structures wherein the electrically active heterojunctions are formed by growing cubic (beta) SiC on hexagonal (alpha) SiC, according to the present invention.
Figure 1B:
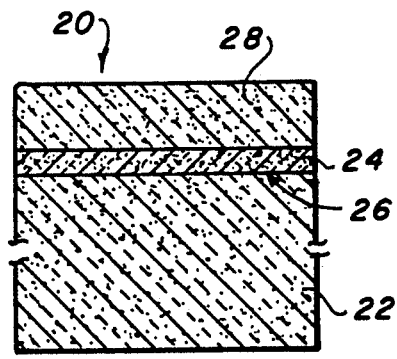

Referring then to FIGS. 1a and 1b as viewed concurrently but specifically to FIG. 1a, an npn-type SiC heterojunction bipolar transistor (HBT) structure 10 is configured to comprise an n-type emitter region (substrate) 12, a p-type base region 14 overlying the n-type emitter region (substrate) 12 contiguously thereto thereby forming an electrically active pn heterojunction 16 therebetween and an n-type collector region 18 overlying the p-type base region 14. Furthermore, the n-type emitter region (substrate) 12 comprises the higher bandgap hexagonal SiC appropriately doped with donor impurities. The p-type base region 14 comprises the lower bandgap cubic SiC appropriately doped with acceptor impurities. The n-type collector region 18 also comprises the lower bandgap cubic SiC but now appropriately doped with donor impurities.

Still referring to FIGS. 1a and 1b as viewed concurrently but now specifically to FIG. 1b, a (pnp type) SiC heterojunction bipolar transistor structure 20 is configured to comprise a p-type emitter region (substrate) 22, an n-type base region 24 overlying the p-type emitter region (substrate) 22 contiguously thereto thereby forming an electrically active np heterojunction 26 therebetween and a p-type collector region 28 overlying the n-type base region 24. Likewise, the p-type emitter region (substrate) 22 comprises the higher bandgap hexagonal SiC but this time appropriately doped with acceptor impurities. The n-type base region 24 and the p-type collector region 28 both comprise the lower bandgap SiC but now each appropriately doped with donor and acceptor impurities, respectively.

The 3C on 6H SiC HBT structures 10 and 20 of FIGS. 1a and 1b, respectively, are constrained to use the 6H SiC substrate as the emitter regions 12 and 22 because they are always the highest bandgap portions of such structures. In contrast, HBTs fabricated of solid solution SiCAlN epitaxial layers on 6H SiC substrates may use the underlying 6H SiC substrate as either the emitter region or the collector region of the HBT structure. The choice is controlled by the relative mole fractions of SiC and AlN in the alloy epitaxial overlayers. This choice will also permit the emitter region to be placed either on the top of the HBT structure or on the bottom.

Figure 2A:
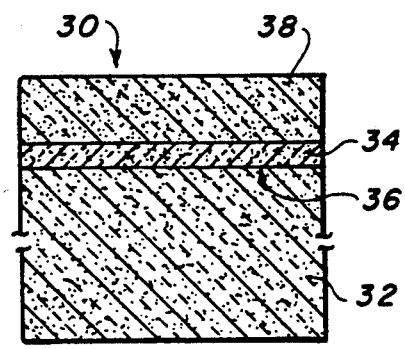
FIGS. 2a and 2b are cross sectional views, in schematic form, illustrating a second embodiment of npn and pnp versions, respectively, of the collector region up heterojunction bipolar transistor structures of FIGS. 1a and 1b wherein the electrically active heterojunctions are now formed by growing a cubic solid solution silicon carbide material (SiCAlN) on hexagonal (alpha) SiC, according to the present invention.
Figure 2B:
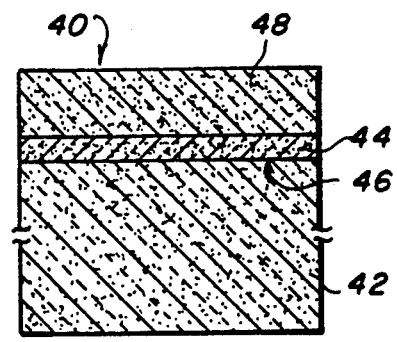

Referring then to FIGS. 2a and 2b as viewed concurrently but specifically to FIG. 2a, an npn-type solid solution SiCAlN heterojunction bipolar transistor (HBT) structure 30 is configured to comprise an n-type emitter region (substrate) 32, a p-type base region 34 overlying the n-type emitter region (substrate) 32 contiguously thereto thereby forming an electrically active pn heterojunction 36 therebetween and an n-type collector region 38 overlying the p-type base region 34. The n-type emitter region (substrate) further comprises the higher bandgap 6H hexagonal SiC appropriately doped with donor impurities. The p-type base region 34 further comprises the lower and variable bandgap cubic (3C) crystalline structure solid solution SiCAlN material appropriately doped with acceptor impurities. The n-type collector region 38 also further comprises the lower and variable bandgap cubic (3C) crystalline structure solid solution SiCAlN but now appropriately doped with donor impurities.

Still referring to FIGS. 2a and 2b as viewed concurrently but now specifically to FIG. 2b, a pnp-type solid solution SiCAlN heterojunction bipolar transistor (HBT) structure 40 is configured to comprise a p-type emitter region (substrate) 42, an n-type base region 44 overlying the p-type emitter region (substrate) 42 contiguously thereto thereby forming an electrically active np heterojunction 46 therebetween and a p-type collector region 48 overlying the n-type base region 44. Similarly, the p-type emitter region (substrate) 42 comprises the higher bandgap 6H hexagonal SiC but this time appropriately doped with acceptor impurities. The n-type base region 44 and the p-type collector region 48 both comprise the lower and variable bandgap cubic (3C) crystalline structure solid solution SiCAlN but now each appropriately doped with donor and acceptor impurities, respectively.

Figure 3A:
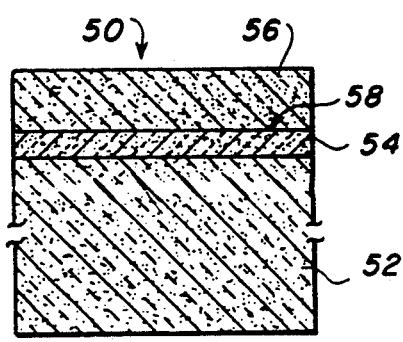
FIGS. 3a and 3b are cross sectional views, in schematic form, illustrating emitter region up configurations of the npn and pnp versions, respectively, of the collector region up heterojunction bipolar transistor structures of FIGS. 2a and 2b.
Figure 3B:
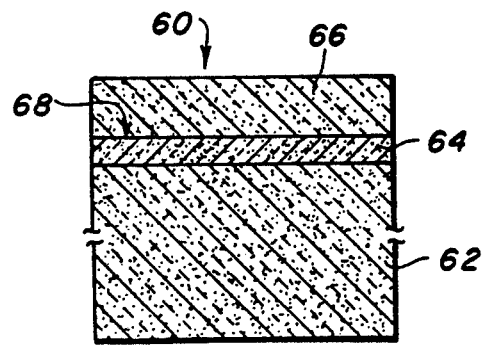

As mentioned earlier, in this second embodiment of the present invention illustrated in FIGS. 2a, 2b, 3a and 3b, the emitter region can be placed either on the top or bottom of the structure. FIGS. 2a and 2b illustrate the emitter region on the bottom of the structure (also termed emitter region down or collector region up). FIGS. 3a and 3b illustrate the emitter region on the top of the structure (also termed emitter region up or collector region down). To reiterate, this emitter region up configuration allows for higher frequency operation of the HBT structure according to the present invention.

Referring then to FIGS. 3a and 3b as viewed concurrently but specifically to FIG. 3a, an emitter region up npn-type solid solution SiCAlN heterojunction bipolar transistor (HBT) structure 50 is configured to comprise an n-type collector region (substrate) 52, a p-type base region 54 overlying the n-type collector region (substrate) 52 and an n-type emitter region 52 overlying the p-type base region 54 contiguously thereto thereby forming an electrically active pn heterojunction 58 therebetween. The n-type collector region (substrate) 52 further comprises the 6H hexagonal SiC appropriately doped with donor impurities. The p-type base region 54 further comprises the equal or higher and variable bandgap cubic (3C) crystalline structure solid solution SiCAlN appropriately doped with acceptor impurities. The n-type emitter region 56 also further comprises a still higher and variable bandgap cubic (3C) crystalline structure solid solution SiCAlN but now appropriately doped with donor impurities.

Still referring to FIGS. 3a and 3b as viewed concurrently but now specifically to FIG. 3b, an emitter region up pnp-type solid solution SiCAlN heterojunction bipolar transistor (HBT) structure 60 is configured to comprise a p-type collector region (substrate) 62, an n-type base region 64 overlying the p-type collector region (substrate) 62 and a p-type emitter region 66 overlying the n-type base region 64 contiguously thereto thereby forming an electrically active np heterojunction 68 therebetween. Similarly, the p-type collector region (substrate) 62 further comprises the 6H hexagonal SiC but this time appropriately doped with acceptor impurities. The n-type base region 64 further comprises the equal or higher and variable bandgap cubic (3C) crystalline structure solid solution SiCAlN appropriately doped with donor impurities. The p-type emitter region 66 also further comprises a still higher and variable bandgap (3C) crystalline structure solid solution SiCAlN but now appropriately doped with acceptor impurities.

The following examples are illustrative of methods suitable for configuring the SiC HBT structures 10 and 20 of FIGS. 1a and 1b, respectively; the solid solution SiCAlN HBT structures 30 and 40 of FIGS. 2a and 2b, respectively; and, the emitter region up solid solution SiCAlN HBT structures 50 and 60 of FIGS. 3a and 3b, respectively. These examples are not intended to limit the scope of the present invention.

EXAMPLE 1

Referring again to FIG. 1a, on fabricating the npn-type SiC HBT structure 10, a non-viscinal [0001] oriented 6H SiC substrate having an n-type nitrogen doping concentration of $2 \times 10^{18}/cm^3$ within the range of 1 to $5 \times 10^{18}/cm^3$ is cleaned with a typical "RCA" clean such as is routinely used in the semiconductor industry ("RCA" is the trade name of the Radio Corporation of America). The 6H SiC substrate is then dipped into a hydrogen fluoride (HF) bath for about 30 seconds and then placed into a growth reactor. The 6H SiC substrate, which will, in operation, be the n-type emitter region (substrate) 12, is elevated to the temperature of 400 Celsius and exposed to atomic hydrogen for about three (3) minutes to remove any residual oxide. For purposes of the present invention, the n-type emitter region (substrate) 12 is typically 1000 micrometers thick. The 6H SiC substrate is then elevated to a temperature of 1200 Celsius within a range of 1120 to 1400 Celsius and exposed to an ethylene ($C_2H_4$) and silane ($SiH_4$) gas flow seeded with triethyl aluminum [$(C_2H_5)_3Al$] or trimethyl aluminum [$(CH_3)_3Al$] to affect the growth of a 3C SiC layer and the necessary aluminum impurity concentrations for the proper doping of this layer, which will, in operation, be the p-type base region 14. The junction formed between the regions 12 and 14 will, in operation, be the electrically active pn heterojunction 16. The seeding flow is adjusted to obtain an aluminum impurity concentration of $2 \times 10^{17}/cm^3$ within the range of 2 to $10 \times 10^{17}/cm^3$ or even higher for applications involving transistors configured to operate in the millimeter wave spectrum. For purposes of the present invention, the p-type base region 14 is typically 50 nanometers thick within a range of 25 to 200 nanometers. Another layer of 3C SiC is grown over the preceding layer by changing the seeding from triethyl aluminum or trimethyl aluminum to ammonia ($NH_3$) to affect the necessary nitrogen impurity concentrations for the proper doping of this layer, which will, in operation, be the n-type collector region 18. The seeding flow is adjusted to obtain a nitrogen impurity concentration of $2 \times 10^{17}/cm^3$ within a range of 1 to $5 \times 10^{17}/cm^3$. The lower end of this range is for logic devices and the higher end thereof is for millimeter wave devices. For purposes of the present invention, the n-type collector region 18 is typically 150 nanometers thick within a range of 100 to 500 nanometers.

EXAMPLE 2

Referring again now to FIG. 1b, in fabricating the pnp-type SiC HBT structure 20, a non-viscinal [0001] oriented 6H SiC substrate having a p-type aluminum doping concentration $2 \times 10^{18}/cm^3$ within the range of 1 to $5 \times 10^{18}/cm^3$ is cleaned, HF dipped and placed into the growth reactor, whereupon the temperature is elevated to 400 Celsius and it is exposed to atomic hydrogen for about three (3) minutes to remove any residual oxide, as explained in Example 1. This 6H SiC substrate will, in operation, be the p-type emitter region (substrate) 22, which is also typically 1000 micrometers thick. The 6H SiC substrate is then elevated to a temperature of 1200 Celsius within a range of 1120 to 1400 Celsius and exposed to an ethylene and silane gas flow seeded with ammonia to affect the growth of a 3C SiC layer and the necessary nitrogen impurity concentrations for the proper doping of this layer, which will, in operation, be the n-type base region 24. The junction formed between the regions 22 and 24 will, in operation, be the electrically active np heterojunction 26. The seeding flow is adjusted to obtain a nitrogen impurity concentration of $5 \times 10^{17}/cm^3$ within a range of 2 to $10 \times 10^{17}/cm^3$. For purposes of the present invention, the n-type base region 24 is 50 nanometers thick within a range of 25 to 200 nanometers. Another layer of 3C SiC is grown over the preceding layer by changing the seeding to triethyl aluminum or trimethyl aluminum from ammonia to affect the necessary aluminum impurity concentrations for the proper doping of this layer, which will, in operation, be the p-type collector region 28. The seeding flow is adjusted to obtain an aluminum impurity concentration of $2 \times 10^{17}/cm^3$ within a range of 1 to $5 \times 10^{17}/cm^3$. For purposes of the present invention, the p-type collector region 28 is typically 150 nanometers thick within a range of 100 to 500 nanometers.

EXAMPLE 3

Referring again to FIG. 2a, in fabricating the npn-type solid solution SiCAlN HBT structure 30, a non-viscinal [0001] oriented 6H SiC substrate having an n-type nitrogen doping concentration of $2 \times 10^{17}/cm^3$ within a range of 2 to $10 \times 10^{17}/cm^3$ is cleaned with a typical "RCA" clean. The 6H SiC substrate is then dipped into HF bath for about 30 seconds after which it is placed into a growth reactor. The 6H SiC substrate, which will, in operation, be the n-type emitter region (substrate) 32, is elevated to the temperature of 400 Celsius and exposed to atomic hydrogen for three (3) minutes to remove any residual oxide. For purposes of the present invention, the n-type emitter region (substrate) 32 is typically 1000 micrometers thick. The 6H Sic substrate is then elevated to a temperature of 950 Celsius within a range of 750 to 1250 Celsius and sequentially exposed to a gas flow of ethylene, silane, trimethyl aluminum, and ammonia with each exposure sufficient to saturate its surface, i.e., 0.5 second. To obtain the require mole fraction of SiCAlN material of lower bandgap than the underlying substrate, the AlN:SiC ratio must be less than 1:1.5. This nonstoichiometric compound can be made by periodically eliminating the aluminum and nitrogen portions of the cycle, as more completely described in a U.S. Pat. application No. 5,225,366 by Max N. Yoder, entitled "An Apparatus for and a Method of Growing Thin Films of Elemental Semiconductors" Serial No. 07/541,990, filed on Jun. 22, 1990, granted on Jul. 6, 1992, and assigned to the same assignee as the present application. The basic sequence is followed by an exposure to atomic hydrogen for 20 seconds and a gas flow seeded with triethyl aluminum or trimethyl aluminum to affect the growth of a 3C SiCAlN layer and the necessary aluminum impurity concentrations for the proper doping of this layer, which will, in operation, be the p-type base region 34. This sequential cycle is repeated a nominal thirteen (13) times to provide for the required base region 34 thickness. The junction formed between the regions 32 and 34 will, in operation, be the electrically active pn heterojunction 36. The seeding flow is adjusted to obtain an aluminum impurity concentration of $5 \times 10^{18}/cm^3$ within a range of 2 to $10 \times 10^{18}/cm^3$ or even higher for applications involving transistors configured to operate in the millimeter wave spectrum. For purposes of the present invention, the p-type base region 34 is typically 50 nanometers thick within a range of 25 to 200 nanometers. Another layer of one hundred thirty (130) sequential cycles of 3C SiCAlN is grown over the preceding layer by changing the seeding from triethyl aluminum or trimethyl aluminum to ammonia to affect the necessary nitrogen impurity concentrations for the proper doping of this layer, which will, in operation, be the n-type collector region 38. The seeding flow is adjusted to obtain a nitrogen impurity concentration of $2 \times 10^{17}/cm^3$ within a range of 1 to $5 \times 10^{17}/cm^3$. For purposes of the present invention, the n-type collector region 38 is typically 150 nanometers thick within a range of 100 to 500 nanometers.

EXAMPLE 4

Referring again now to FIG. 2b, in fabricating the pnp-type solid solution SiCAlN HBT structure 40, a non-viscinal [0001] oriented 6H SiC substrate having a p-type aluminum doping concentration of $2 \times 10^{17}/cm^3$ within a range of 2 to $10 \times 10^{17}/cm^3$ is cleaned, HF dipped and placed into the growth reactor whereupon the temperature is elevated to 400 Celsius and it is exposed to atomic hydrogen for about three (3) minutes to remove any residual oxide. This 6H SiC substrate, which is typically 1000 micrometers thick, will in operation, be the p-type emitter region (substrate) 42. Next, the 6H SiC substrate is elevated to a temperature of 950 Celsius within a range of 750 to 1250 Celsius and sequentially exposed to ethylene, silane, triethyl aluminum, and ammonia with each exposure sufficient to saturate its surface, i.e., 0.5 second. To obtain a SiCAlN material of lower bandgap than the underlying substrate, the AlN:SiC ratio must be less than 1:1.5. This can be accomplished by periodically eliminating the aluminum and nitrogen portions of the cycle as previously mentioned in Example 3. This is followed by an exposure to atomic hydrogen for 20 seconds and a gas flow seeded with ammonia to affect the growth of a 3C SiCAlN layer and the necessary nitrogen impurity concentrations for the proper doping of this layer, which will, in operation, be the n-type base region 44. The junction formed between the regions 42 and 44 will, in operation, be the electrically active np heterojunction 46. This sequential cycle is repeated a nominal thirteen (13) times to provide for the required base region 44 thickness. The seeding flow is adjusted to obtain a nitrogen impurity concentration of $5 \times 10^{18}/cm^3$ within the range of 2 to $10 \times 10^{18}/cm^3$. For purposes of the present invention, the n-type base region 44 is typically 50 nanometers thick within a range of 25 to 200 nanometers. Another layer of one hundred thirty (130) cycles of 3C SiCAlN is grown over the preceding layer by changing the seeding to triethyl aluminum or trimethyl aluminum from ammonia to affect the necessary aluminum impurity concentrations for the proper doping of this layer, which will, in operation, be the p-type collector region 48. The seeding flow is adjusted to obtain an aluminum impurity concentration of $2 \times 10^{17}/cm^3$ within the range of 1 to $5 \times 10^{17}/cm^3$. For purposes of the present invention, the p-type collector region 48 is typically 150 nanometers thick within a range of 100 to 500 nanometers.

EXAMPLE 5

Referring again to FIG. 3a, the fabrication of the emitter region up npn-type solid solution SiCAlN HBT structure 50 is similar to Example 3 except that the 6H SiC substrate is now the n-type collector region (substrate) 52 having an n-type nitrogen doping concentration of $2 \times 10^{17}/cm^3$ within a range of 1 to $5 \times 10^{17}/cm^3$. For purposes of the present invention, the n-type collector region (substrate) 52 is typically 1000 micrometers thick. To obtain a SiCAlN material of higher bandgap than the underlying substrate, the AlN:SiC ratio must exceed 1.4:1 for the base region 54 and 1.55:1 for the emitter region 56. The p-type base region 54 (a 3C SiCAlN layer) is grown upon the underlying 6H SiC substrate, and, accordingly, the n-type collector region (substrate) 52. The p-type aluminum impurity concentration is adjusted to be $5 \times 10^{18}/cm^3$ within a range of 2 to $10 \times 10^{18}/cm^3$. For purposes of the present invention, the p-type base region 54 is typically 50 nanometers thick within a range of 25 to 200 nanometers. The n-type emitter region 56 (a 3C SiCAlN layer) is grown over the preceding layer, the p-type base region 54, such that the junction formed therebetween, in operation, is the electrically active pn heterojunction 58. The n-type nitrogen impurity concentration is adjusted to $2 \times 10^{18}/cm^3$ within the range of 2 to $10 \times 10^{18}/cm^3$. For purposes of the present invention, the n-type emitter region 56 is typically 150 nanometers thick within a range of 100 to 500 nanometers.

EXAMPLE 6

Referring again now to FIG. 3b, the fabrication of the emitter region up pnp-type solid solution SiCAlN HBT structure 60 is similar to Examples 4 and 5 except that the 6H SiC substrate is now the p-type collector region (substrate) 62 having a p-type aluminum doping concentration of $2 \times 10^{17}/cm^3$ within a range of 1 to $5 \times 10^{17}/cm^3$. For purposes of the present invention, the p-type collector region (substrate) 62 is typically 1000 micrometers thick. The n-type base region 64 (a 3C SiCAlN layer) is grown upon the underlying 6H SiC substrate, and, thus, the p-type collector region (substrate) 62. The n-type nitrogen impurity concentration is adjusted to be $5 \times 10^{18}/cm^3$ within a range of 2 to $10 \times 10^{18}/cm^3$. For purposes of the present invention, the n-type base region 64 is typically 50 nanometers thick within a range of 25 to 200 nanometers. The p-type emitter region 66 (a 3C SiCAlN layer) is grown over the preceding layer, the n-type base region 64, such that the junction formed therebetween, in operation, is the electrically active pn heterojunction 68. The p-type aluminum impurity concentration is adjusted to be $2 \times 10^{17}/cm^3$ within the range of 2 to $10 \times 10^{17}/cm^3$. For purposes of the present invention, the p-type emitter region 66 is typically 150 nanometers within a range of 100 to 500 nanometers.

To those skilled in the art, many modifications and variations of the present invention are possible in light of the above teachings. It is therefore to be understood that the present invention can be practiced otherwise than as specifically described herein and still be within the spirit and scope of the appended claims.

What is claimed is:

1. A silicon carbide (SiC) heterojunction bipolar transistor (HBT) structure comprising:
   an emitter region of a hexagonal SiC material;
   a base region of a first cubic SiC material overlying said emitter region contiguously thereto so as to form an electrically active heterojunction therebetween; and
   a collector region of a second cubic SiC overlying said base region.

2. The SiC HBT structure of claim 1 wherein said emitter region is about 1000 micrometers thick, said base region is within a thickness range of 50 to 200 nanometers, and said collector region is within a thickness range of 100 to 500 nanometers.

3. The SiC HBT structure of claim 1 wherein said hexagonal SiC material is appropriately doped with donor impurities, said first cubic SiC material is appropriately doped with acceptor impurities, and said second cubic SiC material is appropriately doped with donor impurities such that said emitter region (substrate) becomes an n-type emitter region (substrate), said base region becomes a p-type base region, said collector region becomes an n-type collector region and said SiC HBT structure becomes an npn-type SiC HBT structure.

4. The npn-type SiC HBT structure of claim 3 wherein said n-type emitter region (substrate) includes an n-type nitrogen impurity having a doping concentration within a range of 2 to $10 \times 10^{18}/cm^3$, said p-type base region includes a p-type aluminum impurity having a doping concentration within a range of 2 to $10 \times 10^{17}/cm^3$, and said n-type collector region includes an n-type nitrogen impurity having a doping concentration within a range of 1 to $5 \times 10^{17}/cm^3$.

5. The SiC HBT structure of claim 1 wherein said hexagonal SiC material is appropriately doped with acceptor impurities, said first cubic SiC material is appropriately doped with donor impurities, and said second cubic SiC material is appropriately doped with acceptor impurities such that said emitter region (substrate) becomes a p-type emitter region (substrate), said base region becomes an n-type base region, said collector region becomes a p-type collector region and said SiC HBT structure becomes a pnp-type SiC HBT structure.

6. The pnp-type SiC HBT structure of claim 5 wherein said p-type emitter region (substrate) includes a p-type aluminum impurity having a doping concentration within a range of 2 to $10 \times 10^{18}/cm^3$, said n-type base region includes an n-type nitrogen impurity having a doping concentration within a range of 2 to $10 \times 10^{17}/cm^3$, and said p-type collector region includes a p-type aluminum impurity having a doping concentration within a range of 1 to $5 \times 10^{17}/cm^3$.

7. A solid solution SiCAlN heterojunction bipolar transistor (HBT) structure comprising:
   an emitter region (substrate) of a hexagonal SiC material;
   a base region of a first cubic solid solution SiCAlN material overlying said emitter region (substrate) contiguously thereto so as to form an electrically active heterojunction therebetween; and
   a collector region of a second cubic solid solution SiCAlN material overlying said base region.

8. The solid solution SiCAlN HBT structure of claim 7 wherein said emitter region (substrate) is about 1000 micrometers thick, said base region is within a thickness range of 25 to 200 nanometers, and said collector region is within a thickness range of 100 to 500 nanometers.

9. The solid solution SiCAlN HBT structure of claim 7 wherein said hexagonal SiC material is appropriately doped with donor impurities, said first cubic solid solution SiCAlN material is appropriately doped with acceptor impurities, said second cubic solid solution SiCAlN material is appropriately doped with donor impurities such that said emitter region (substrate) becomes an n-type emitter region (substrate), said base region becomes a p-type base region, said collector region becomes an n-type collector region and said solid solution SiCAlN HBT structure becomes an npn-type solid solution SiCAlN HBT structure.

10. The solid solution SiCAlN HBT structure of claim 9 wherein said n-type emitter region (substrate) includes an n-type nitrogen impurity having a doping concentration within a range of 2 to $10 \times 10^{17}/cm^3$, said p-type base region includes a p-type aluminum impurity having a doping concentration within a range of 2 to $10 \times 10^{18}/cm^3$, and said n-type collector region includes an n-type nitrogen impurity having a doping concentration within a range of 1 to $5 \times 10^{17}/cm^3$.

11. The solid solution SiCAlN HBT structure of claim 7 wherein said hexagonal SiC material is appropriately doped with acceptor impurities, said first cubic solid solution SiCAlN material is appropriately doped with donor impurities, and said second cubic solid solution SiCAlN material is appropriately doped with acceptor impurities such that said emitter region (substrate) becomes a p-type emitter region (substrate), said base region becomes an n-type base region, said collector region becomes a p-type collector region and said solid solution SiCAlN HBT structure becomes a pnp-type solid solution SiCAlN HBT structure.

12. The pnp-type solid solution SiCAlN HBT structure of claim 11 wherein said p-type emitter region (substrate) includes a p-type aluminum impurity having a doping concentration within a range of 2 to $10 \times 10^{17}/cm^3$, said n-type base region includes an n-type nitrogen impurity having a doping concentration within a range of 2 to $10 \times 10^{18}/cm^3$, and said p-type collector region includes a p-type aluminum impurity having a doping concentration within a range of 1 to $5 \times 10^{17}/cm^3$.

13. A solid solution SiCAlN heterojunction bipolar transistor (HBT) structure comprising:
   a collector region (substrate) of a hexagonal SiC material;
   a base region of a first cubic solid solution SiCAlN material overlying said collector region (substrate); and
   an emitter region of a second cubic solid solution SiCAlN material overlying said base region contiguously thereto so as to form an electrically active heterojunction therebetween.

14. The solid solution SiCAlN HBT structure of claim 13 wherein said collector region (substrate) is about 1000 micrometers thick, said base region is within a thickness range of 25 to 200 nanometers, and said emitter region is within a thickness range of 100 to 500 nanometers.

15. The solid solution SiCAlN HBT structure of claim 13 wherein said hexagonal SiC material is appropriately doped with donor impurities, said first cubic solid solution SiCAlN material is appropriately doped with acceptor impurities, and said second cubic solid solution SiCAlN material is appropriately doped with donor impurities such that said collector region (substrate) becomes an n-type collector region (substrate), said base region becomes a p-type base region, said emitter region becomes an n-type emitter region and said solid solution SiCAlN HBT structure becomes an emitter region up npn-type solid solution SiCAlN HBT structure.

16. The emitter region up npn-type solid solution SiCAlN HBT structure of claim 15 wherein said n-type collector region (substrate) includes an n-type nitrogen impurity having a doping concentration within a range of 2 to $10 \times 10^{17}$cm$^3$, said p-type base region includes a p-type aluminum impurity having a doping concentration within a range of 2 to $10 \times 10^{18}$/cm$^3$, and said n-type emitter region includes an n-type nitrogen impurity having a doping concentration within a range of 1 to $5 \times 10^{17}$/cm$^3$.

17. The solid solution SiCAlN HBT structure of claim 13 wherein said hexagonal SiC material is appropriately doped with acceptor impurities, said first cubic solid solution SiCAlN material is appropriately doped with donor impurities, and said second cubic solid solution SiCAlN material is appropriately doped with acceptor impurities such that said collector region (substrate) becomes a p-type collector region (substrate), said base region becomes an n-type base region, said emitter region becomes a p-type emitter region and said solid solution SiCAlN HBT structure becomes an emitter region up pnp-type solid solution SiCAlN HBT structure.

18. The emitter region up pnp-type solid solution SiCAlN HBT structure of claim 17 wherein said p-type collector region (substrate) includes a p-type aluminum impurity having a doping concentration within a range of 2 to $10 \times 10^{17}$/cm$^3$, said n-type base region includes an n-type nitrogen impurity having a doping concentration within a range of 2 to $10 \times 10^{18}$/cm$^3$, and said p-type emitter region includes a p-type aluminum impurity having a doping concentration within a range of 1 to $5 \times 10^{17}$/cm$^3$.

* * * * *